United States Patent [19]
Ohta et al.

[11] 4,304,832
[45] Dec. 8, 1981

[54] PHOTOSENSITIVE RESIN COMPOSITION CONTAINING DIAZODIPHENYLAMINE-ALDEHYDE CONDENSATE

[75] Inventors: Katsuyuki Ohta, Kanagawa; Shigeru Otawa, Zama; Shunichi Kasukawa, Yamato, all of Japan

[73] Assignee: Tokyo Ohka Kogyo Kabushiki Kaisha, Kawasaki, Japan

[21] Appl. No.: 158,290

[22] Filed: Jun. 10, 1980

[30] Foreign Application Priority Data

Jun. 23, 1979 [JP] Japan .................................. 54-79298

[51] Int. Cl.$^3$ ........................ G03C 1/60; G03C 1/71
[52] U.S. Cl. .................................... 430/175; 430/176
[58] Field of Search .............................. 430/175, 176

[56] References Cited

U.S. PATENT DOCUMENTS

| | | | |
|---|---|---|---|
| 2,826,501 | 3/1958 | Hodgins | 430/176 |
| 3,113,022 | 12/1963 | Cassiers | 430/176 |
| 3,840,390 | 10/1974 | Mozu et al. | 430/176 |
| 4,123,276 | 10/1978 | Kita | 430/176 |

Primary Examiner—Jack P. Brammer
Attorney, Agent, or Firm—Brisebois & Kruger

[57] ABSTRACT

The invention provides a novel photosensitive or photocurable resin composition suitable for the preparation of a planographic printing plate exhibiting excellent performance in development with an aqueous alkaline development solution as well as good ink-respectivity to form the image areas on the printing plate and high durability in printing. The resin composition comprises an acrylic copolymer and a diazo compound as the essential ingredients and the acrylic copolymer is composed of the recurring monomer units derived from alkyl esters of acrylic or methacrylic acid, from acrylonitrile or methacrylonitrile and from acrylic or methacrylic acid as the comonomers in limited proportions.

9 Claims, No Drawings

PHOTOSENSITIVE RESIN COMPOSITION CONTAINING DIAZODIPHENYLAMINE-ALDEHYDE CONDENSATE

BACKGROUND OF THE INVENTION

The present invention relates to a photosensitive or photocurable resin composition and a planographic printing plate prepared with the resin composition as the photosensitive material. In particular, the present invention relates to a photosensitive resin composition suitable for the development with an aqueous alkaline development solution when it is used as the photosensitive material for the preparation of a planographic printing plate. More particularly, the invention relates to a photosensitive resin composition capable of forming image areas with excellent mechanical strengths and ink-receptivity on a planographic printing plate.

In the prior art, there has been known a process for the preparation of a planographic printing plate in which a base plate is coated with a photosensitive diazo resin such as a condensation product of 4-diazodiphenylamine and formaldehyde followed by exposure to light through a negative transparency to photocure the resin in the exposed areas and development by dissolving away the uncured resin with water into a negative type planographic printing plate. Several kinds of diazo resins are proposed as suitable for use in the above described plate making process (see, for example, Japanese Patent Publication Nos. 38-8907 and 38-11365).

One of the problems in these diazo photosensitive resins is that the mechanical strengths of the photocured layers of the resin in the areas exposed to light is insufficient when the resin is used as such. Proposed means as a remedy of the above defect of the diazo resins include providing a reinforcement overcoating layer on the photocured layer of the diazo resin by coating with a lacquer and improving the mechanical strengths of the diazo resin by formulating it with another resin having good abrasion resistance. Usually, the latter method is preferred since the method of the lacquer reinforcement must be carried out in complicated steps.

The requirements for the resin to be blended with the photosensitive diazo resin are good compatibility with the diazo resin, stability of the photosensitive resin blend, large difference in the solubility in the development solution between the areas exposed and unexposed to light and high mechanical strengths as well as good ink-receptivity of the photocured resin composition on the areas exposed to light forming the image areas of the printing plate.

Unfortunately, however, none of the hitherto proposed photosensitive diazo resin compositions are satisfactory in one or more respects of the above requirements. For example, a resin composition disclosed in Japanese Patent Publication No. 52-7364 and U.S. Pat. No. 2,826,501, which is a combination of a diazo compound and water- or alkali-soluble polymer compound, is defective in the poor stability during storage and the low ink-receptivity of the photocured layer of the resin composition forming the image areas of the printing plate even though the resin composition has a good development performance, i.e. large difference in the solubility in the development solution between the areas exposed and unexposed to light.

Recently, a photosensitive resin composition suitable for the preparation of a planographic printing plate has been disclosed in U.S. Pat. No. 4,123,276. The photosensitive resin composition here proposed comprises a diazo compound and a resin which is a copolymer composed of recurring units of hydroxyalkyl acrylate or methacrylate, acrylonitrile or methacrylonitrile and an $\alpha,\beta$-unsaturated carboxylic acid such as acrylic acid or methacrylic acid.

The above disclosed photosensitive resin composition is also not free from several drawbacks. For example, firstly, the ink-receptivity of the photocured layer of the resin composition is not always satisfactory, presumably, due to the large contents of the hydrophilic groups of hydroxyl and carboxyl groups. The ink-receptivity of the resin composition can be improved by admixing another kind of resin having good ink-receptivity but admixture of such a modifier resin causes a second problem that the compatibility of the resin and the diazo compound is sometimes poor so that the coating solution of the resin composition must be prepared by use of limited kinds of organic solvents. Furthermore, the solubility of the uncured resin composition is relatively low even in the recommended development solution so that the development process takes usually as long as about 1 minute or longer.

SUMMARY OF THE INVENTION

It is therefore an object of the present invention to provide a novel and improved photosensitive resin composition suitable for the preparation of a planographic printing plate free from the above described problems in the prior art photosensitive resin compositions used for the purpose.

Another object of the present invention is to provide a novel planographic printing plate prepared by use of the above resin composition as the photosensitive material with very much improved processability in the preparation thereof as well as with excellent printability and durability in the printing process therewith.

The photosensitive resin composition of the present invention suitable for the preparation of a planographic printing plate comprises:

(A) a copolymer containing
(a) from 30 to 80% by weight of the recurring monomer units represented by the general formula,

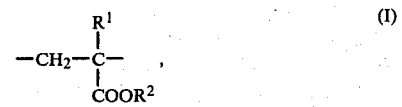

in which $R^1$ is a hydrogen atom or a methyl group and $R^2$ is an alkyl group, (b) from 15 to 60% by weight of the recurring monomer units represented by the general formula

in which $R^3$ has the same meaning as defined for $R^1$ in the general formula (I) above, and (c) from 5 to 20% by weight of the recurring monomer units represented by the general formula

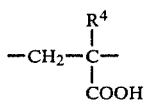

in which $R^4$ has the same meaning as defined for $R^1$ in the general formula (I) above, the balance, if any, being recurring monomer units derived from ethylenically unsaturated monomers not in conformity with the above given general formula (I), (II) and (III), and (B) a diazo compound.

The above described photosensitive resin composition is readily cured by exposure to light to become insoluble while the uncured resin composition is easily dissolved away by an aqueous alkaline solution so that a planographic printing plate can be prepared by coating a base plate with the above described resin composition followed by pattern-wise exposure to light to insolubilize the resin composition in the exposed areas and development with an aqueous alkaline development solution to dissolve away the uncured resin composition in the unexposed areas leaving the photocured resin composition on the exposed areas forming the image areas of the planographic printing plate with excellent durability and ink-receptivity.

DETAILED DESCRIPTION OF THE PREFERRED EMBODIMENTS

The inventors have conducted extensive investigations to obtain a novel polymeric resin suitable for use as a base resin in the photosensitive resin composition as the photosensitive material in the preparation of a planographic printing plate as blended with a diazo compound to discover that the above defined copolymer is far better than any one of the prior art copolymeric resins of the similar types.

The base resin in the inventive photosensitive resin composition is, as is described above, a copolymer of which three classes of the monomer units are the essential components. The first class of the recurring monomer units is represented by the general formula (I) above given, in which $R^1$ is a hydrogen atom or a methyl group and $R^2$ is an alkyl group having, preferably, from 1 to 10 or, more preferably, from 1 to 6 carbon atoms. These monomer units are derived from alkyl acrylate or alkyl methacrylate and incorporated into the copolymer by the copolymerization involving these monomers. Particular examples of the alkyl acrylates and methacrylates suitable in the present invention are methyl, ethyl, propyl, butyl, hexyl, octyl, nonyl and decyl esters of acrylic acid or methacrylic acid or, preferably, ethyl acrylate, methyl methacrylate, n-butyl methacrylate and hexyl methacrylate. These (meth)acrylate esters may be used either singly or as a combination of two kinds or more according to need.

The recurring monomer units of the second class represented by the general formula (II) above are obtained by including acrylonitrile and/or methacrylonitrile in the monomer mixture for the copolymerization. Preferred nitrile monomer is acrylonitrile.

The monomer units of the third class are incorporated into the copolymer by the copolymerization of a monomer mixture including acrylic acid and/or methacrylic acid. The preferred unsaturated acid component is methacrylic acid.

The copolymerization of the above described three classes of the monomers is carried out by a conventional procedure of radical polymerization in which predetermined amounts of the individual comonomers are mixed and dissolved in a suitable organic solvent such as ethyleneglycol monomethyl ether, dioxane and the like with admixture of a radical polymerization initiator such as an organic peroxide, e.g. benzoyl peroxide or an azo compound, e.g. azobisisobutyronitrile and then heated, if necessary, with agitation. The conditions of the polymerization reaction must be controlled so as that the resultant copolymer may have an average molecular weight in the range from 10,000 to 500,000 l or, preferably, from 30,000 to 100,000 in order that the copolymer product has properties most suitable for the preparation of a planographic printing plate.

The proportions among the above named three classes of the monomer units are very important in the copolymer in order that the copolymer resin has wellbalanced properties suitable for the plate making process. For example, the content of the (meth)acrylate ester components of the general formula (I) in the copolymer should be in the range from 30 to 80% by weight or, preferably, from 40 to 70% by weight, the content of the (meth)acrylonitrile component of the general formula (II) should be in the range from 15 to 60% by weight or, preferably, from 20 to 50% by weight, and the content of the (meth)acrylic acid component of the general formula (III) should be in the range from 5 to 20% by weight or, preferably, from 8 to 15% by weight.

The above given weight proportions are determined in consideration of the characteristic properties imparted by each class of the components. For example, the (meth)acrylate ester component is used to improve the ink-receptivity of the photocured resin composition so that larger amounts of this component are preferred when high ink-receptivity is desired disregarding the disadvantage of decreased mechanical strengths caused by the use of an excessive amount of this component over the above given range.

The second class of the monomer units, i.e. the (meth)acrylonitrile component, serves to increase the mechanical strengths of the photocured resin composition in the areas exposed to light on the planographic printing plate contributing to the improvement of the printing durability of the printing plate owing to the increased hydrophobic property of the resin or lesser degree of swelling by the aqueous development solution used in the development of the plate after exposure to light. On the other hand, increase of the amount of this second class component leads to a copolymer with decreased solubility in organic solvents so that the coating solution of the resin composition must be prepared with limited kinds of solvents which also should dissolve the diazo compound.

The amount of the third class of the monomer units, i.e. the (meth)acrylic acid component, has a close relationship with the acid value of the resultant copolymer which should be controlled within the range from 30 to 130. When the acid value of the copolymer is smaller than 30, the resultant resin composition may have a poor development performance while an acid value larger than 130 of the copolymer resin results in swelling of the photocured layer of the resin composition in the areas exposed to light or decrease the ink-receptivity of the photocured resin layer.

In addition to the above described three classes of the essential monomer units, the copolymer resin may contain small amounts, say, 30% by weight or smaller, of the other types of monomer units. These optional monomer units are incorporated into the copolymer by copolymerizing the above three classes of the comonomers with one or more of the other kinds of monomers copolymerizable therewith including unsaturated carboxylic acid amides such as acrylamide and methacrylamide, vinyl ethers such as methylvinyl ether and octylvinyl ether, aromatic vinyl compounds such as styrene and α-methylstyrene and vinyl esters such as vinyl acetate and vinyl propionate.

The copolymer resin produced by the solution polymerization as described above is then purified, for example, by precipitation with admixture of a precipitant solvent to the polymerization mixture in order to remove the unreacted monomers and other impurities. The thus purified copolymer resin in a weighed amount is then dissolved together with the diazo compound in a suitable solvent such as methyl alcohol and ethyleneglycol monomethyl ether along with other conventional additive ingredients used for the preparation of planographic printing plates such as a blue dye to enhance the contrast between the image areas and the non-image areas of the printing plate.

The diazo compound may be any one of those compounds used conventionally as the photosensitizing ingredient in the art but it has desirably good compatibility with the copolymer resin as the base component of the inventive resin composition. Examples of diazo compounds suitable for use are condensation products of formaldehyde or acetaldehyde with a diphenylamine compound such as 4-diazodiphenylamine, 4-diazo-3-methyldiphenylamine, 4-diazo-4'-methoxydiphenylamine, 4-diazo-3-methyl-4'-ethoxydiphenylamine and the like. Particularly suitable diazo compounds are salts of the above named diazo compounds with an organic sulfonic acid such as benzenesulfonic acid, toluenesulfonic acid, naphthalenesulfonic acid, propylnapththalenesulfonic acid, 2-hydroxy-4-methoxybenzophenone-5-sulfonic acid and the like.

The amount of the diazo compound in the inventive resin composition is not particularly limitative but usually in the range from 5 to 40% by weight or, preferably, from 10 to 20% by weight based on the acrylic copolymer resin as the base component. When the amount of the diazo compound is smaller than the above range, disadvantages are caused in the lowered mechanical strengths of the photocured layer of the resin composition on the image areas of the printing plate as well as the decreased stability of the plate in storage while an excessive amount of the diazo compound may lead to the decrease of the photosensitivity of the resin composition in exposure to light and less desirable performance of development with an aqueous alkaline development solution.

In addition to the essential components (A) and (B) and the organic solvent as well as the blue dyes mentioned above as one of the optional ingredients, the photosensitive composition of the invention may contain any other additive ingredients conventionally used in the preparation of a planographic printing plate such as the other kinds of dyes, pigments, stabilizers and the like.

No particular explanation may be necessary for the procedure of the preparation of a printing plate with the above described photosensitive resin composition. Thus, the photosensitive resin composition is diluted with a suitable solvent such as methyl alcohol and ethyleneglycol monomethyl ether into an appropriate viscosity suitable for coating and the sulution is applied on to the surface of a desired base plate made of, for example, polyethylene, zinc, copper, aluminum, glass and the like followed by drying. The method for coating is not limitative including spray coating, brush coating, dipping, flow coating, whirler coating and others. The thickness of the coating layer is preferably in the range from 0.5 to 3 g/m$^2$ as dried according to particular need. It is of course optional that the surface of the plate is roughened or, when the base plate is an aluminum plate, anodized in advance in order to enhance the bonding strength of the coating layer to the base plate or to enhance the affinity to water as well as to improve the mechanical strengths of the aluminum base plate.

The thus prepared plate provided with the photosensitive layer is then exposed to light, preferably, rich in ultraviolet pattern-wise through a negative transparency so that the resin composition in the areas exposed to light becomes insolubilized in an aqueous alkaline development solution to form the image areas of the printing plate while the resin composition in the unexposed areas remains soluble to be removed or dissolved away by the treatment with the development solution leaving the surface of the base plate exposed bare to form the non-image areas on the printing plate.

One of the advantages obtained with the inventive photosensitive composition is that the areas exposed to light and the unexposed areas on the printing plate are clearly distinguishable in a dark room under yellow lighting with the safelight.

The planographic printing plates prepared in accordance with the invention exhibit excellent ink-receptivity on the image areas and possess very high durability in printing.

Following are the examples to illustrate the photosensitive resin composition and the planographic printing plate of the invention in further detail.

EXAMPLE 1

A polymerization mixture was prepared by dissolving 60 g of methyl methacrylate, 30 g of acrylonitrile, 10 g of methacrylic acid and 1.5 g of azobisisobutyronitrile in 200 g of ethyleneglycol monomethyl ether and the polymerization was carried out at 80° C. for 4 hours under an atmosphere of nitrogen. After completion of the polymerization reaction, the mixture was poured into a large volume of water and the precipitated polymer product was collected by filtration and dried in a vacuum desiccator.

The above obtained acrylic copolymer had an acid value of 80 and an average molecular weight of about 70,000.

A photosensitive resin composition was prepared by dissolving 1.5 g of the above prepared acrylic copolymer, 0.2 g of a p-toluenesulfonic acid salt of a condensation product of 4-diazodiphenylamine and formaldehyde and 0.045 g of a blue dye (Oil Blue #603, a product of Orient Chemical Co.) in 50 g of a 1:1 by weight mixture of ethyleneglycol monomethyl ether and methyl alcohol.

The photosensitive resin composition above prepared was applied on to the surface of an aluminum plate mechanically ground and anodized in a sulfuric acid solution in advance in a coating thickness of about 1.5 g/m$^2$ as dried followed by drying to give a master plate for planographic printing plate.

The plate was then directly contacted with a negative transparency, through which it was exposed to light for 1 minute with an ultra-high pressure mercury lamp placed 100 cm apart above the plate. After exposure to light, the exposed areas were clearly distinguished from the unexposed areas under a yellow safelight.

The plate after exposure to light was subjected to the development treatment at room temperature with an aqueous alkaline development solution prepared by dissolving 1 g of sodium metasilicate, 4 g of sodium laurylsulfate and 6 g of ethyleneglycol monophenyl ether in 94 g of water. It was found that a development time of 25 seconds was sufficient to obtain a satisfactory printing plate in which the resin composition in the unexposed areas was completely dissolved away to form the non-image areas of the printing plate with the bare surface of the base plate while pattern-wise layer of the photocured resin composition in the exposed areas remained as such to form the image areas. No noticeable adverse effect was observed in the results of the development even when the time of development treatment was extended to 5 minutes. The master plate was storable with good stability without noticeable changes in the photosensitivity or performance in development when kept at 40° C. in an atmosphere of 80% relative humidity for 10 days or longer.

The planographic printing plate thus prepared was used in a test printing run as mounted on a Heidelberg KORD printing machine to show excellent ink-receptivity on the image areas with satisfactory transfer of the printing ink from the inking roller even at the very beginning of the run yielding only 5 sheets of spoilage on wood-free paper. The printing plate was also highly durable in continued printing run producing more than 100,000 sheets of satisfactory printed materials.

EXAMPLE 2

An acrylic copolymer was prepared by the polymerization of a mixture obtained by dissolving 25 g of ethyl acrylate, 25 g of hexyl methacrylate, 22 g of acrylonitrile, 8 g of methacrylic acid and 2 g of azobisisobutyronitrile in 200 g of dioxane carried out in the same manner as in Example 1. The acrylic copolymer had an acid value of 60 and an average molecular weight of about 60,000.

A photosensitive resin composition was prepared by dissolving 2 g of the above obtained acrylic copolymer, 0.2 g of the same diazo resin as used in Example 1 and 0.06 g of the same blue dye as in Example 1 in 50 g of ethyleneglycol monomethyl ether.

A planographic printing plate was prepared with the above photosensitive resin composition in the same manner as in Example 1. A development time of 30 seconds was satisfactory at room temperature with a development solution prepared by dissolving 3 g of benzyl alcohol, 10 g of methyl carbitol and 1 g of monoethanolamine in 86 g of water.

The storage stability of the master plate was good enough to show no noticeable changes when kept for 10 days or longer under the same conditions as in Example 1.

The printing plate exhibited good ink-receptivity to give only 3 sheets of spoilage at the beginning of the printing run and excellent durability in continued printing run to give more than 100,000 sheets of satisfactory printed materials.

EXAMPLE 3

An acrylic copolymer was prepared by the polymerization carried out in the same manner as in Example 1 with a mixture obtained by dissolving 45 g of n-butyl methacrylate, 40 g of acrylonitrile, 15 g of methacrylic acid and 2 g of azobisisobutyronitrile in 200 g of ethyleneglycol monomethyl ether. The acrylic copolymer obtained had an acid value of 110 and an average molecular weight of about 50,000.

A photosensitive resin composition was prepared by dissolving 1.5 g of the above acrylic copolymer, 0.2 g of a salt of 2-hydroxy-4-methoxybenzophenone-5-sulfonic acid with a condensation product of 4-diazodiphenylamine and paraformaldehyde and 0.045 g of the same blue dye as used in Example 1 in 50 g of ethyleneglycol monomethyl ether and a planographic printing plate was prepared with the above photosensitive resin composition in the same manner as in Example 1.

The performance of the printing plate in a printing test was as good as in Example 1 to give more than 150,000 sheets of printed materials of high quality.

COMPARATIVE EXAMPLE 1

The same experimental procedure as in Example 1 was repeated except that the monomer mixture copolymerized was composed of 66 g of methyl methacrylate, 32 g of acrylonitrile and 2 g of methacrylic acid. The resultant copolymer had an acid value of 12.

The preparation of the printing plate and the printing test indicated that more than 2 minutes of development time was necessary and the storage stability of the master plate was lower than in Example 1 to be storable only for 2 days under the same conditions. Otherwise the results were as good as in Example 1.

COMPARATIVE EXAMPLE 2

The experimental procedure was also the same as in Example 1 except that the monomer mixture copolymerized was composed of 50 g of methyl methacrylate, 25 g of acrylonitrile and 25 g of methacrylic acid. The resultant copolymer had an acid value of 150.

A good printing plate was obtained with a development time of 25 seconds but an extension of the development time to 5 minutes resulted in partial loss of the image areas. The storage stability of the master plate was as good as in Example 1.

The ink-receptivity of the printing plate was somewhat poorer than in Example 1 to give more than 10 sheets of spoilage and the printing durability of the printing plate was limited to give about 50,000 sheets of satisfactory printed materials.

COMPARATIVE EXAMPLE 3

A photosensitive resin composition was prepared by dissolving 2 g of an acrylic copolymer obtained by the copolymerization of a monomer mixture composed of 50 g of 2-hydroxyethyl methacrylate, 30 g of acrylonitrile, 17 g of methyl methacrylate and 3 g methacrylic acid, 0.2 g of the same p-toluenesulfonic acid salt of the condensation product of 4-diazodiphenylamine and formaldehyde as used in Example 1 and 0.06 g of the same blue dye as used in Example 1 in 50 g of ethyleneglycol monomethyl ether.

Preparation of the master plate and pattern-wise exposure of it to light were carried out in the same manner as in Example 1. The development test undertaken with the development sulution prepared in Example 2 indicated that about 40 seconds of development time was necessary. The master plate was storable for about 7 days when kept under the same conditions as in Example 1.

The ink-receptivity of the printing plate was poor to give more than 10 sheets of spoilage and the durability of the plate in printing was also somewhat limited to give about 80,000 sheets of satisfactory printed materials.

We claim:

1. A photosensitive resin composition which comprises
   (A) an acrylic copolymer composed of the recurring monomer units comprising:
      (a) from 30 to 80% by weight of the monomer units represented by the general formula

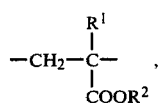

in which $R^1$ is a hydrogen atom or a methyl group and $R^2$ is an alkyl group,
      (b) from 15 to 60% by weight of the monomer units represented by the general formula

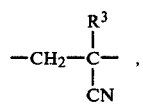

in which $R^3$ is a hydrogen atom or a methyl group, and
      (c) from 5 to 20% by weight of the monomer units represented by the general formula

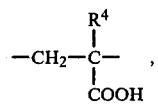

in which $R^4$ is a hydrogen atom or a methyl group, and
   (B) a condensation product of formaldehyde or acetaldehyde with a 4-diazodiphenylamine compound.

2. The photosensitive resin composition as claimed in claim 1 wherein $R^2$ is an alkyl group having from 1 to 10 carbon atoms.

3. The photosensitive resin composition as claimed in claim 1 wherein $R^3$ is a hydrogen atom.

4. The photosensitive resin composition as claimed in claim 1 wherein $R^4$ is a methyl group.

5. The photosensitive resin composition as claimed in claim 1 wherein the acrylic copolymer contains at least 70% by weight of the recurring monomer units belonging to the classes of (a), (b) and (c).

6. The photosensitive resin composition as claimed in claim 1 wherein the acrylic copolymer has an average molecular weight in the range from 10,000 to 500,000.

7. The photosensitive resin composition as claimed in claim 1 wherein the acrylic copolymer has an acid value in the range from 30 to 130.

8. The photosensitive resin composition as claimed in claim 1 wherein the amount of the diazo compound is in the range from 5 to 40% by weight based on the acrylic copolymer.

9. The photosensitive resin composition as claimed in claim 1 wherein the condensation product of formaldehyde or acetaldehyde with a 4-diazodiphenylamine compound is in the form of a salt with an organic sulfonic acid.

* * * * *